US012787387B2

(12) United States Patent
Lin et al.

(10) Patent No.: US 12,787,387 B2
(45) Date of Patent: Nov. 3, 2026

(54) SEMICONDUCTOR DEVICE WITH FACET S/D FEATURE AND METHODS OF FORMING THE SAME

(71) Applicant: Taiwan Semiconductor Manufacturing Co., Ltd., Hsin-Chu (TW)

(72) Inventors: Zhi-Chang Lin, Zhubei City (TW); Shih-Cheng Chen, New Taipei City (TW); Jung-Hung Chang, Changhua County (TW); Lo-Heng Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1136 days.

(21) Appl. No.: 17/872,439

(22) Filed: Jul. 25, 2022

(65) Prior Publication Data

US 2022/0359659 A1 Nov. 10, 2022

Related U.S. Application Data

(62) Division of application No. 16/901,919, filed on Jun. 15, 2020, now Pat. No. 11,398,550.

(51) Int. Cl.
*H10D 62/13* (2025.01)
*H10D 64/01* (2025.01)

(52) U.S. Cl.
CPC ......... *H10D 62/151* (2025.01); *H10D 64/017* (2025.01)

(58) Field of Classification Search
CPC . H10D 30/6735; H10D 64/017; H10D 64/679
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |

(Continued)

*Primary Examiner* — Ali Naraghi
(74) *Attorney, Agent, or Firm* — HAYNES AND BOONE, LLP

(57) ABSTRACT

Semiconductor device and the manufacturing method thereof are disclosed. An exemplary method comprises alternately forming first semiconductor layers and second semiconductor layers over a substrate, wherein the first semiconductor layers and the second semiconductor layers include different materials and are stacked up along a direction substantially perpendicular to a top surface of the substrate; forming a dummy gate structure over the first and second semiconductor layers; forming a source/drain (S/D) trench along a sidewall of the dummy gate structure; forming inner spacers between edge portions of the first semiconductor layers, wherein the inner spacers are bended towards the second semiconductor layers; and epitaxially growing a S/D feature in the S/D trench, wherein the S/D feature contacts the first semiconductor layers and includes facets forming a recession away from the inner spacers.

20 Claims, 21 Drawing Sheets

(56) References Cited

U.S. PATENT DOCUMENTS

| | | | | |
|---|---|---|---|---|
| 9,236,300 | B2 | 1/2016 | Liaw | |
| 9,520,482 | B1 | 12/2016 | Chang et al. | |
| 9,576,814 | B2 | 2/2017 | Wu et al. | |
| 9,954,058 | B1 * | 4/2018 | Mochizuki | H10D 30/014 |
| 10,903,317 | B1 | 1/2021 | Frougier et al. | |
| 11,205,711 | B2 | 12/2021 | Wang et al. | |
| 2018/0175046 | A1 | 6/2018 | Chiou et al. | |
| 2019/0148515 | A1 * | 5/2019 | Cheng | B82Y 10/00 257/347 |
| 2019/0305104 | A1 * | 10/2019 | Xie | B82Y 10/00 |
| 2020/0286992 | A1 * | 9/2020 | Song | H10D 30/43 |
| 2021/0210598 | A1 * | 7/2021 | Cheng | B82Y 10/00 |
| 2021/0391423 | A1 | 12/2021 | Lin et al. | |

* cited by examiner

SEMICONDUCTOR DEVICE WITH FACET S/D FEATURE AND METHODS OF FORMING THE SAME

PRIORITY DATA

The present application is a divisional application of U.S. patent application Ser. No. 16/901,919, filed Jun. 15, 2020, which is incorporated herein by reference in its entirety.

BACKGROUND

The integrated circuit (IC) industry has experienced exponential growth. Multi-gate devices have been introduced to improve gate control by increasing gate-channel coupling and reducing off-state current. One such multi-gate device is a nanosheet device. A nanosheet device substantially refers to any device having a channel region including separated semiconductor channels, and a gate structure, or portions thereof, formed on more than one side of the semiconductor channels (for example, surrounding the semiconductor channels). In some instances, a nanosheet device is also called as a nanowire device, a nanoring device, a gate-surrounding device, a gate-all-around (GAA) device, or a multi-channel bridge device. Nanosheet transistors are compatible with conventional complementary metal-oxide-semiconductor (CMOS) fabrication processes and allow aggressive scaling down of transistors.

However, fabrication of nanosheet transistors presents challenges. For example, in a conventional nanosheet device, a high parasitic capacitance may occur between the epitaxial S/D features and the metal gate due to the high-k material and the limited thickness of the inner spacer between the epitaxial S/D features and the metal gate. In addition, the inner spacers are easy to be damaged during the epitaxial feature clean/etching process or SiGe layer removing process. Therefore, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
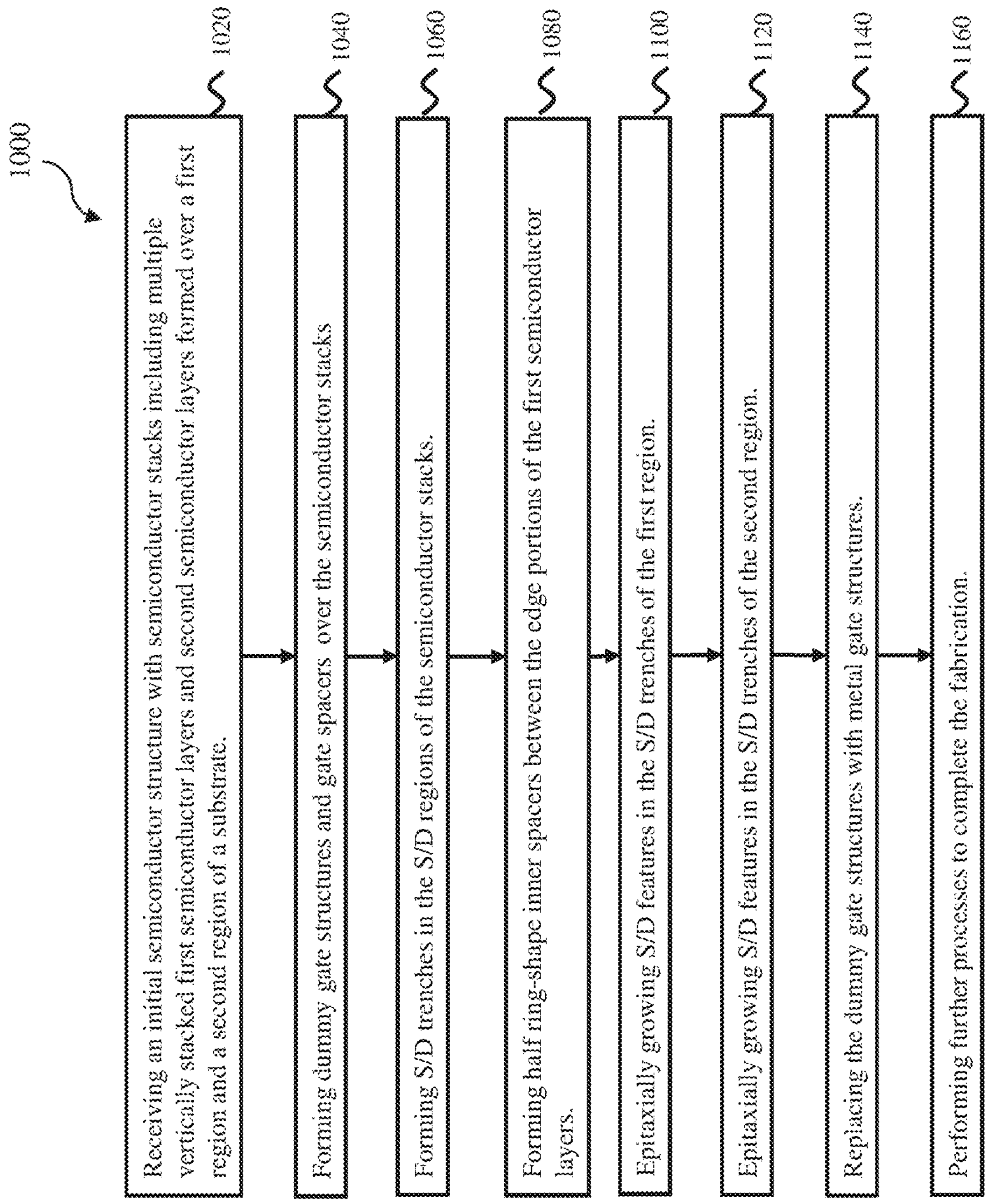
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is substantially related to semiconductor devices and the fabrication thereof, and more particularly to methods of fabricating field-effect transistors (FETs), such as nanosheet FETs.

In a nanosheet device, a channel region of a single device may comprise multiple layers of semiconductor material (also referred to as channel semiconductor layers) physically separated from one another. In some examples, a gate of the device is disposed above, alongside, and even between the semiconductor layers of the device. However, due to the high-k material (for example, k is about 5 to about 7) and the limited thickness of the inner spacer between the metal gate and the epitaxial S/D feature, a high parasitic capacitance may occur between the metal gate and the epitaxial S/D feature. To reduce the parasitic capacitance, an air gap is formed between the epitaxial S/D feature and the metal gate. In some embodiments, the air gap includes a first portion formed by a half-ring-shape inner spacer and a second portion formed by the epitaxial S/D feature. The air gap can reduce the parasitic capacitance between the metal gate and the epitaxial S/D feature and can protect the inner spacer from being damage during the fabrication, thus can improve the performance of the semiconductor device.

Figure 2:
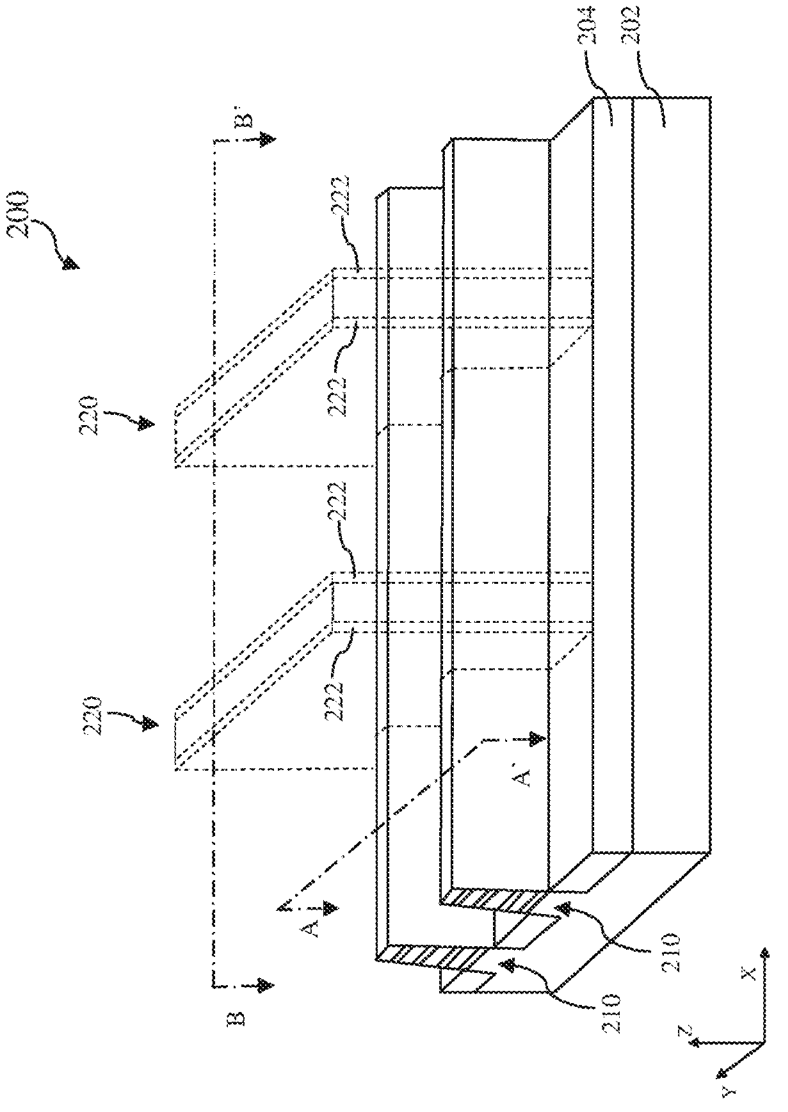
FIG. 2 illustrates a three-dimensional perspective view of the initial example semiconductor device accordance with some embodiments of the present disclosure.

FIG. 1 illustrates a flow chart of a method 1000 for making an example semiconductor device 200 (hereinafter, device 200) in accordance with some embodiments of the present disclosure. Method 1000 is merely an example and is not intended to limit the present disclosure beyond what is explicitly recited in the claims. Additional operations can be performed before, during, and after method 1000, and some operations described can be replaced, eliminated, or moved around for additional embodiments of the method. Method 1000 is described below in conjunction with other figures, which illustrate various three-dimensional and cross-sectional views of the device 200 during intermediate steps of method 1000. In particular, FIG. 2 is a three-dimensional view of an initial structure of device 200 in accordance with some embodiments of the present disclosure. FIGS. 3A-19A illustrate cross-sectional views of the device 200 taken along the plane A-A' shown in FIG. 2 (that is, in an Y-Z plane) at intermediate stages of the method 1000 in accordance with some embodiments of the present disclosure. FIGS. 3B-19B illustrate cross-sectional views of the device 200 taken along the plane B-B' shown in FIG. 2 (that is, in an X-Z plane) at intermediate stages of the method 1000 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Figure 3B:
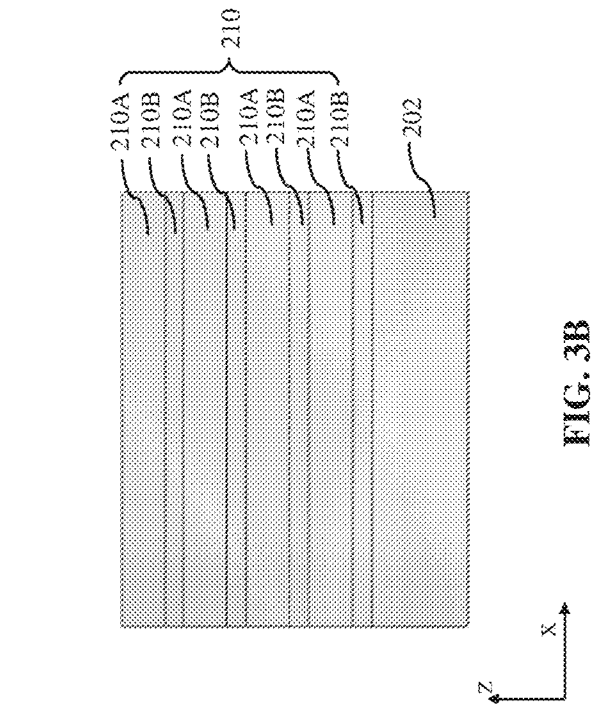
FIGS. 3B, 4B, 5B, 6B, 7B, 8B, 9B, 10B, 11B, 12B, 13B, 14B, 15B, 16B, 17B, 18B, and 19B illustrate cross-sectional views of the semiconductor device along line B-B' in the three-dimensional perspective view at intermediate stages of the method of FIG. 1 in accordance with some embodiments of the present disclosure.
Figure 3A:
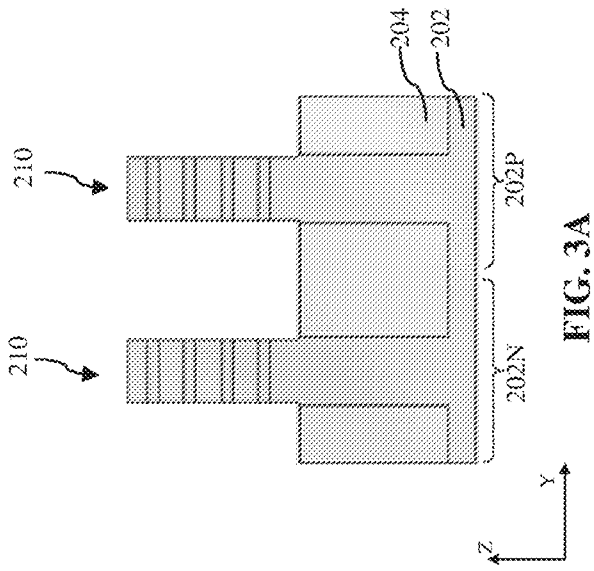
FIGS. 3A, 4A, 5A, 6A, 7A, 8A, 9A, 10A, 11A, 12A, 13A, 14A, 15A, 16A, 17A, 18A, and 19A illustrate cross-sectional views of the semiconductor device along line A-A' in the three-dimensional perspective view at intermediate stages of the method of FIG. 1 in accordance with some embodiments of the present disclosure.

Referring to FIGS. 1, 2, 3A and 3B, at operation 1020, an initial semiconductor structure of device 200 is formed. As depicted in FIGS. 2, 3A and 3B, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. In some embodiments, the substrate 202 may include PFET region 202P comprising n-type doped substrate regions (such as n-well) doped with n-type dopants, such as phosphorus (for example, $^{31}P$), arsenic, other n-type dopant, or combinations thereof. In some embodiments, the substrate 202 may include NFET region 202N comprising p-type doped substrate regions (such as p-well) doped with p-type dopants, such as boron (for example, $^{11}B$, $BF_2$), indium, other p-type dopant, or combinations thereof. In some embodiments, the substrate 202 includes doped regions formed with a combination of p-type dopants and n-type dopants. An ion implantation process, a diffusion process, and/or other suitable doping process can be performed to form the various doped regions.

The device 200 includes alternating semiconductor layers formed over the substrate 202, such as semiconductor layers 210A including a first semiconductor material and semiconductor layers 210B including a second semiconductor material that is different from the first semiconductor material. The different semiconductor materials of the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, alternating SiGe/Si/SiGe/Si/ . . . layers are arranged from bottom to top. In some embodiments, the material of the top semiconductor layer may or may not be the same as the bottom semiconductor layer. In some embodiments, no intentional doping is performed when forming the semiconductor layers 210A. In some other embodiments, the semiconductor layers 210A may be doped with a p-type dopant or an n-type dopant. The number of the semiconductor layers 210A and 210B depends on the design requirements of device 200. For example, it may comprise one to ten layers of semiconductor layers 210A or 210B each. The topmost semiconductor layer may be a 210A layer (for example, including Si) or a 210B layer (for example, including SiGe). In some embodiments, different semiconductor layers 210A and 210B have the same thickness in the Z-direction. In some other embodiments, different semiconductor layers 210A and 210B have different thicknesses. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, such as a metal organic CVD (MOCVD) process, and/or other suitable epitaxial growth processes.

Thereafter, the alternating semiconductor layers 210A and 210B are patterned to form semiconductor stacks 210 (hereinafter the stacks 210). In some embodiments, various photoresist lithography and etching processes may be performed to the semiconductor layers 210A and 210B to form the stacks 210 in fin-shapes as illustrated in FIG. 2. For example, a patterned photoresist mask is formed over the device 200. The patterned photoresist mask covers the fin positions according to the design requirement of device 200. Subsequently, one or more etching processes are performed using the patterned photoresist mask to remove the exposed portions of the first and second semiconductor layers 210A and 210B. The remained portions of the first and second semiconductor layers 210A and 210B form the fin-shape stacks 210. In some embodiments, a top portion of the substrate 202 is also removed. The etching process includes dry etching, wet etching, other suitable etching process, or combinations thereof. The photoresist mask is then removed using any proper method (such as a plasma ashing process).

Thereafter, an isolation structure 204 is formed in the trenches between the stacks 210 to separate and isolate the active regions of device 200. In some embodiments, one or more dielectric materials, such as silicon dioxide (SiO)

and/or silicon nitride (SiN), is deposited over the substrate 202 along sidewalls of the stack 210. The dielectric material may be deposited by CVD (such as plasma enlarged CVD (PECVD)), physical vapor deposition (PVD), thermal oxidation, or other techniques. Subsequently, the dielectric material is recessed (for example, by etching and/or chemical mechanical polishing (CMP)) to form the isolation structure 204.

Figure 4B:
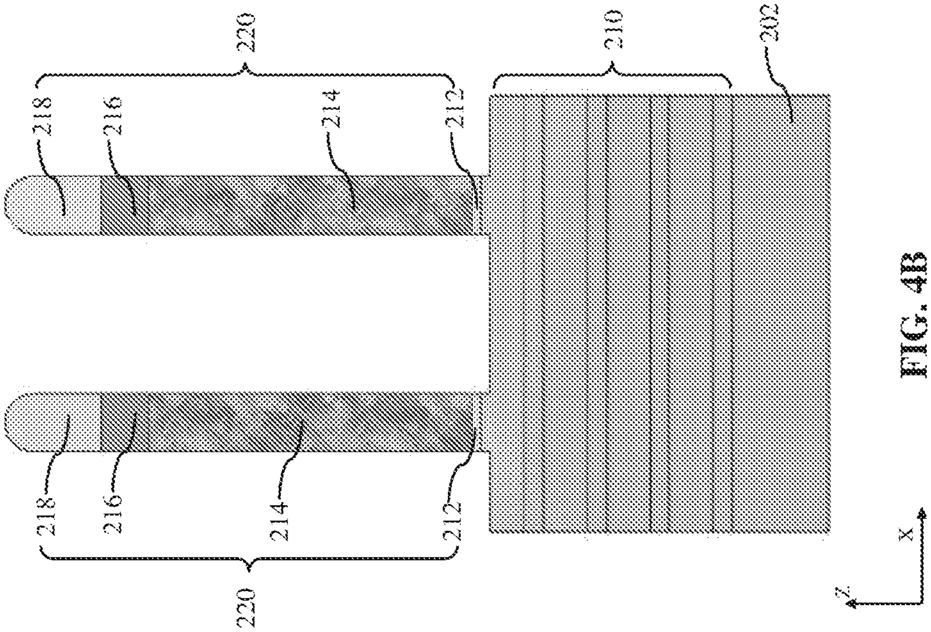
Figure 4A:
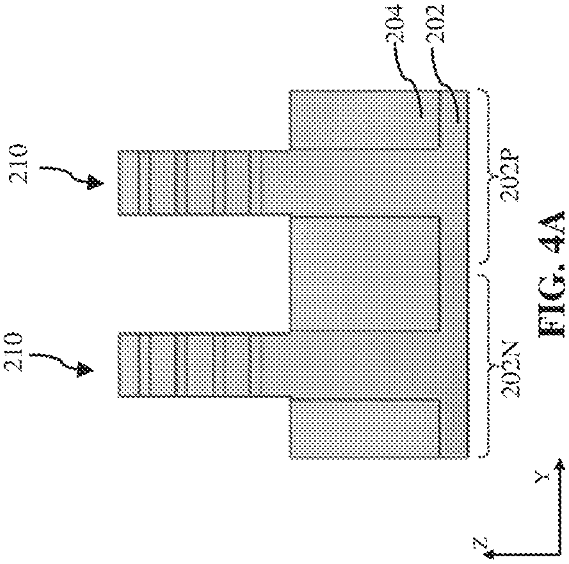

Referring to FIGS. 1, 4A and 4B, at operation 1040, dummy gate structures 220 are then formed over the stacks 210. The dummy gate structures 220 are also illustrated in dashed lines in FIG. 2. Each dummy gate structure 220 serves as a placeholder for subsequently forming a metal gate structure. In some embodiments, the dummy gate structures 220 extend along the Y-direction and traverse respective stacks 210. The dummy gate structures 220 cover the channel regions of the stacks 210 which interpose the source regions and the drain regions (both referred to as the S/D regions). Each of the dummy gate structures 220 may include various dummy layers. For example, an interfacial layer 212 over the stacks 210 and a dummy gate electrode 214 (for example, including polysilicon) over the interfacial layer 212. In some embodiments, the dummy gate structures 220 also include one or more hard mask layers, such as hard mask layer 216 and hard mask layer 218 (for example, including a dielectric material such as SiN, silicon carbonitride (SiCN), SiO, etc.), and/or other suitable layers. The dummy gate structures 220 are formed by deposition processes, lithography processes, etching processes, other suitable processes, or combinations thereof. For example, different dummy gate layers are deposited over the stacks 210. A lithography process is then performed to form a mask covering the channel regions of the stacks 210. Thereafter, the different dummy gate layers are etched using the lithography mask to form the dummy gate structures 220. The lithography mask is then removed using any proper method.

Figure 5A:
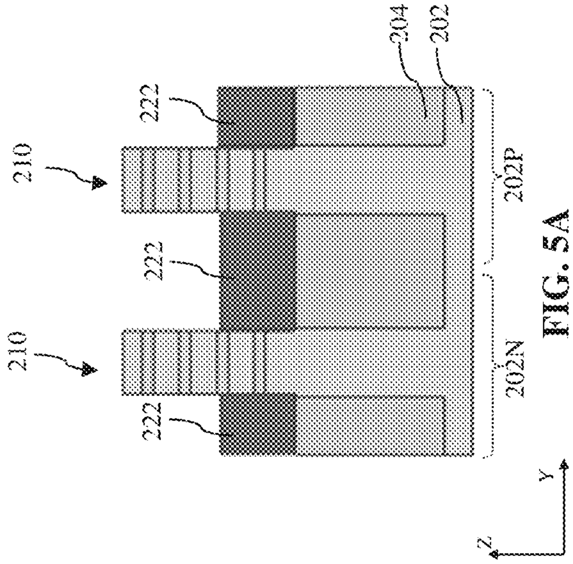
Figure 5B:
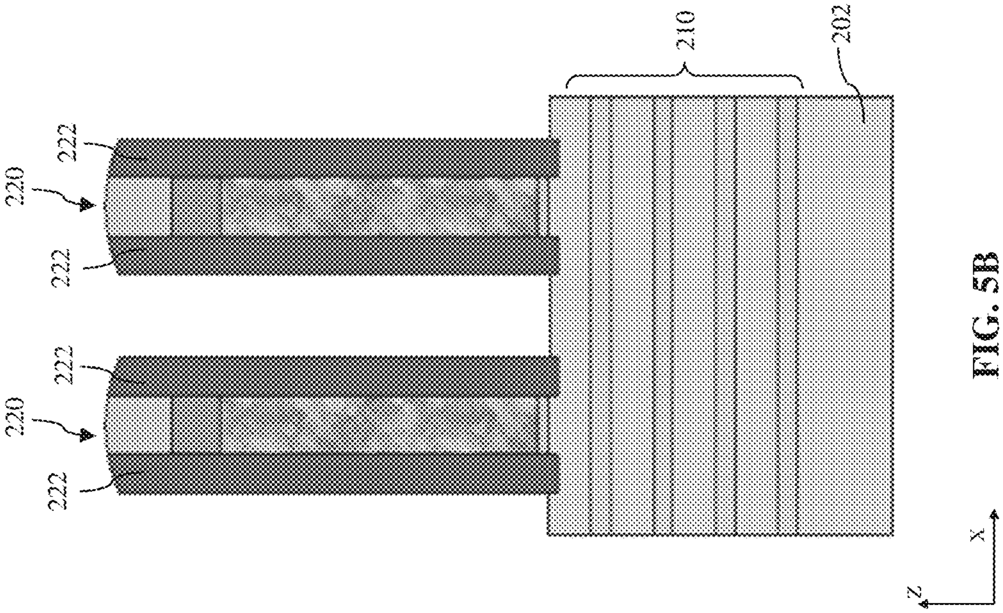

Referring to FIGS. 1, 5A and 5B, still at operation 1040, gate spacers 222 are formed along sidewalls of the dummy gate structures 220. The gage spacers 222 are also illustrated in dashed lines in FIG. 2. In some embodiment, the gate spacers 222 are also formed along sidewalls of the stacks 210. In some embodiments, the gate spacers 222 comprises a dielectric material, such as SiO, SiN, silicon oxynitride (SiON), silicon carbide (SiC), other dielectric material, or a combination thereof. The formation of the gate spacers 222 involves various deposition and etching processes. In some embodiments, first, a gate spacer layer is deposited (for example, by atomic layer deposition (ALD), CVD, PVD, or other proper process) over the device 200. Next, an anisotropic etching process is performed to remove the gate spacer layer in the X-Y plane (the plane in which the top surface of the substrate 202 is), while keeping the gate spacer layer along the Z-direction. The remained portions of the gate spacer layer along the Z-direction form the gate spacers 222. The anisotropic etching process includes wet etching, dry etching, or combinations thereof.

Figure 6B:
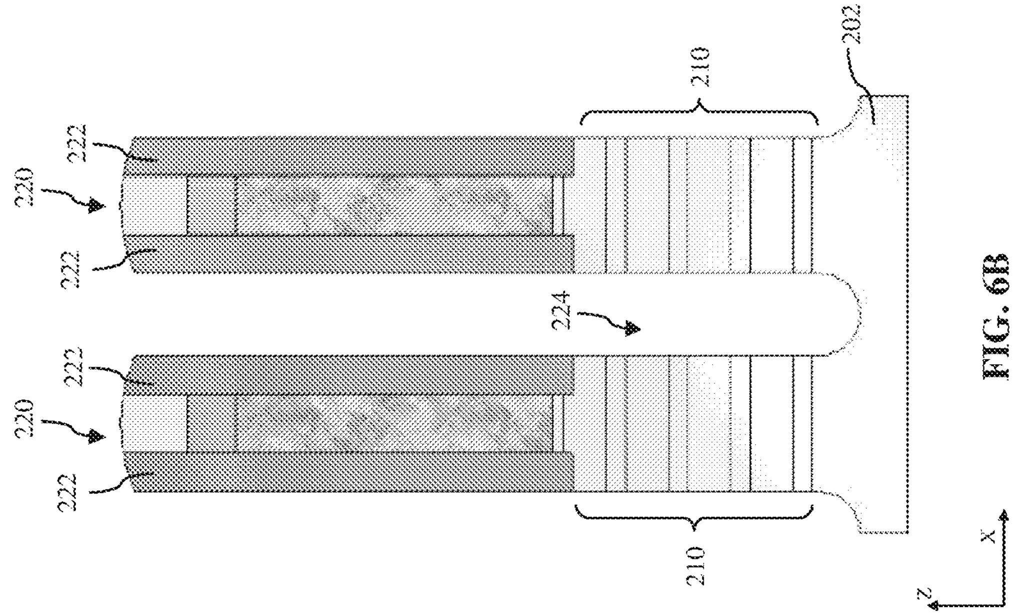
Figure 6A:
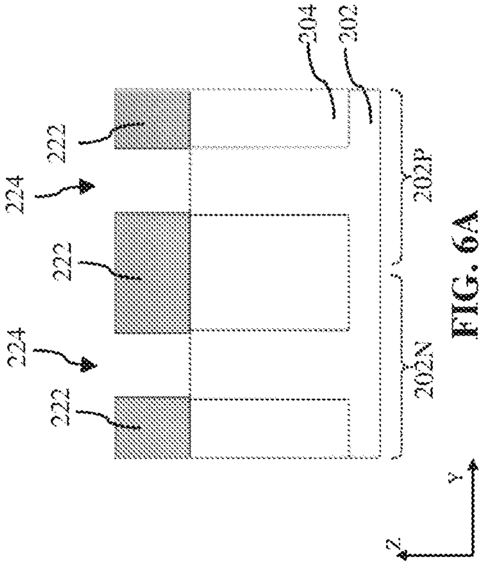

Referring to FIGS. 1, 6A and 6B, at operation 1060, S/D trenches 224 are formed in the S/D regions of the stacks 210. In some embodiments, the stacks 210 are recessed by a S/D etching process along sidewalls of the gate spacers 222 to form the S/D trenches 224. The S/D etching process may be a dry etching process (such as a reactive ion etching (RIE) process), a wet etching process, or combinations thereof. The duration of the S/D etching process is controlled such that the sidewalls of each semiconductor layers 210A and 210B are exposed in the S/D trenches 224. In other words, the semiconductor layers 210A and 210B are truncated by the S/D trenches 224. Each semiconductor layer 210A or 210B is separated into two or more corresponding portions. As depicted in FIG. 6B, top portions of the substrate 202 in the S/D trenches 224 are also removed, and the recessed surfaces of the substrate 202 in the S/D trenches 224 form bottom surfaces of the S/D trenches 224.

Figure 7B:
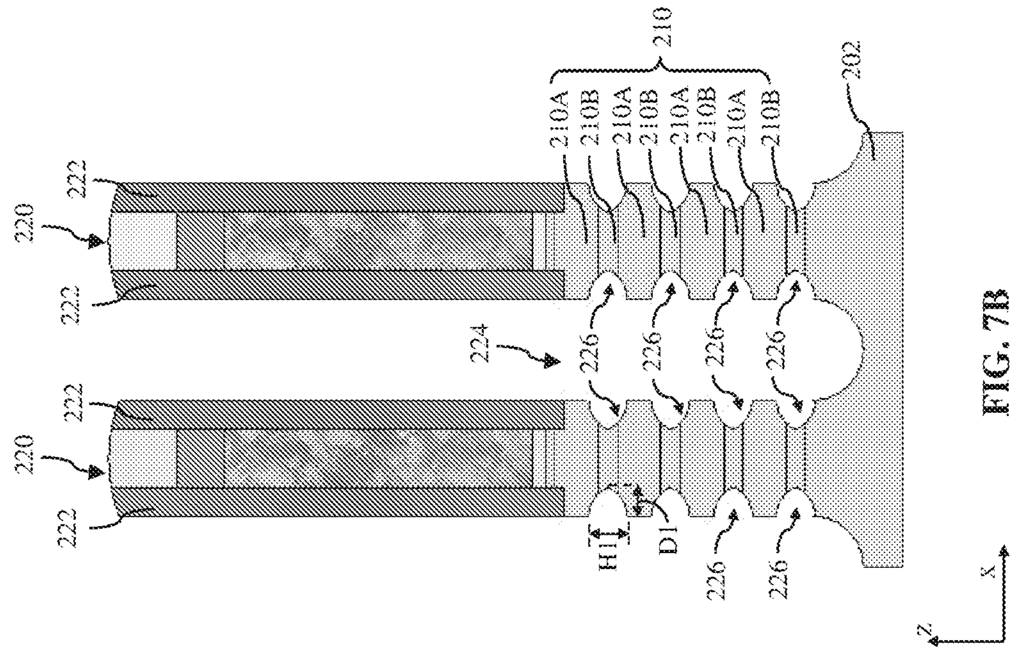
Figure 7A:
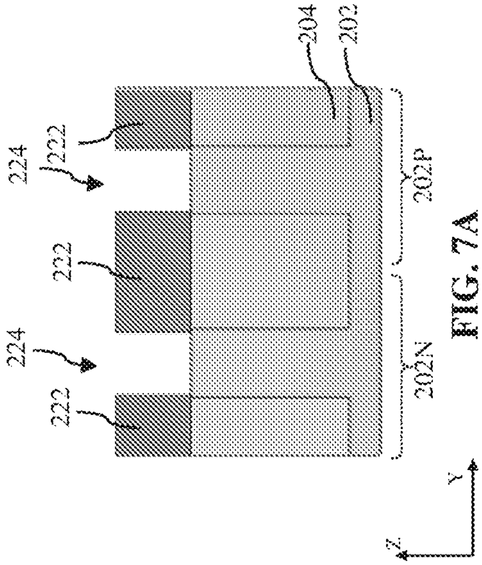

Now referring to FIGS. 1, 7A-10A and 7B-10B, at operation 1080, inner spacers 228 are formed between the edge portions of the semiconductor layers 210A. Referring to FIG. 7B, the portions (edges) of the semiconductor layers 210B exposed in the S/D trenches 224 are selectively removed by a suitable etching process to form gaps 226 between the edge portions of the semiconductor layers 210A. In other words, the edge portions of the semiconductor layers 210A are suspended in the S/D trenches 224. Due to the different oxidation rates and/or etching selectivities of the materials of the semiconductor layers 210A (for example, Si) and 210B (for example, SiGe), only exposed portions (edges) of the semiconductor layers 210B are removed, while the semiconductor layers 210A remain substantially unchanged. In some embodiments, the selective removal of the exposed portions of the semiconductor layers 210B may include an oxidation process followed by a selective etching process. For example, the edge portions of the semiconductor layers 210B are first selectively oxidized to include a material of SiGeO. Then, a selective etching process is performed to remove the SiGeO with a suitable etchant such as ammonium hydroxide ($NH_4OH$) or hydro fluoride (HF). The duration of the oxidation process and the selective etching process can be controlled such that only edge portions of the semiconductor layers 210B are selectively removed. The gaps 226 may be of different shapes according to the different etching parameters. In some embodiments, each of the gaps 226 may be of a half-ellipse-shape, a triangle-shape (with curved sides), a rectangular-shape (with round corners), or other shapes. In some embodiments, each of the gaps 226 has a height (i.e. an opening size) H1 in the Z-direction, and a depth D1 in the X-direction. In some embodiments, the height H1 is about 4 nm to about 20 nm, and the depth D1 is about 5 nm to about 20 nm, such that a bended (for example, a half-ring-shape) inner spacer may formed within the gap 226, but not fill up the gap 226.

Figure 8B:
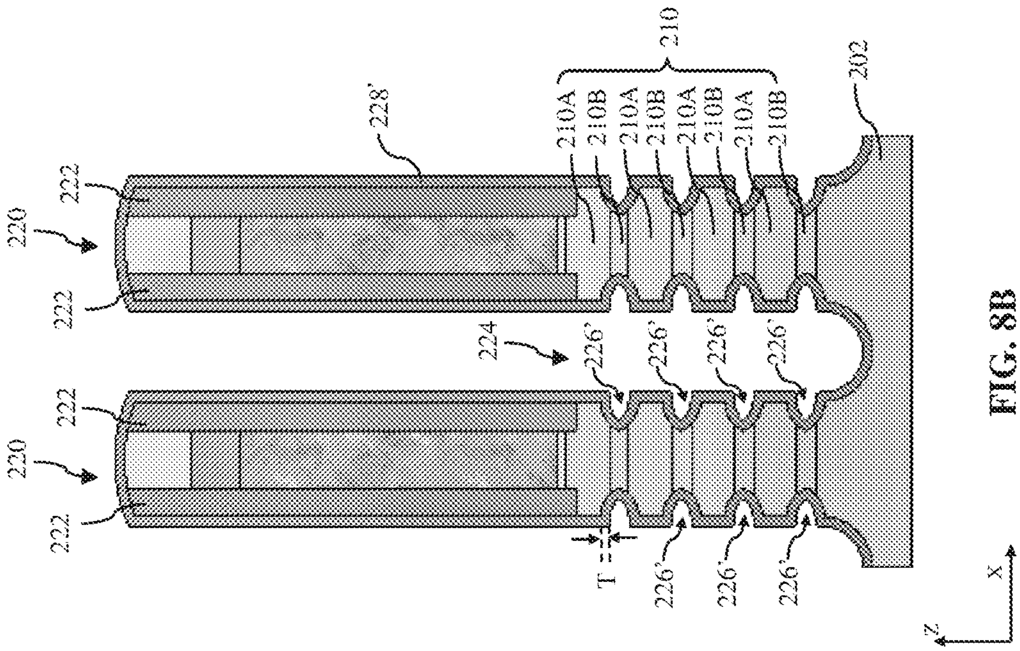
Figure 8A:
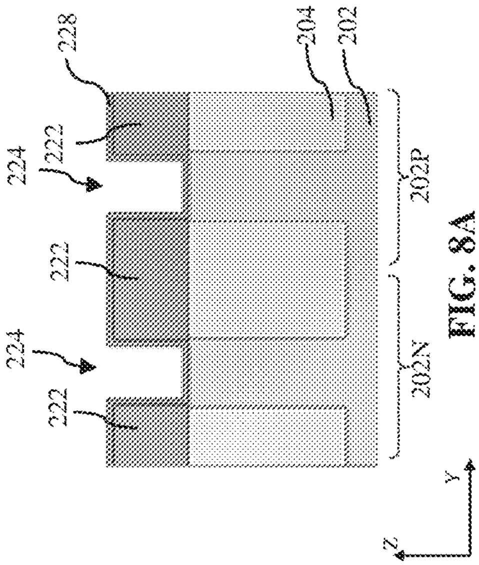

Thereafter, referring to FIGS. 8A and 8B, an inner spacer layer 228' is deposited over the device 200. The inner spacer layer 228' comprises a dielectric material including oxygen, nitrogen, and/or carbon, such as SiON, SiCN, SiOC, SiOCN, or combinations thereof. The inner spacer layer 228' may be conformally deposited along the sidewalls of the gate spacers 222, in the S/D trenches 224 and in the gaps 226. In some embodiments, the inner spacer layer 228' is deposited by ALD. In some embodiments, the inner spacer layer 228' has a conformally thickness T of about 1 nm to about 5 nm, such that the inner spacer layer 228' do not fill up the gaps 226 between the edge portions of the semiconductor layers 210A and are bended towards the semiconductor layers 210B. As depicted in FIG. 8B, a gap 226' is formed and is surrounded by the bended portions of the inner spacer layer 228'.

Figure 9B:
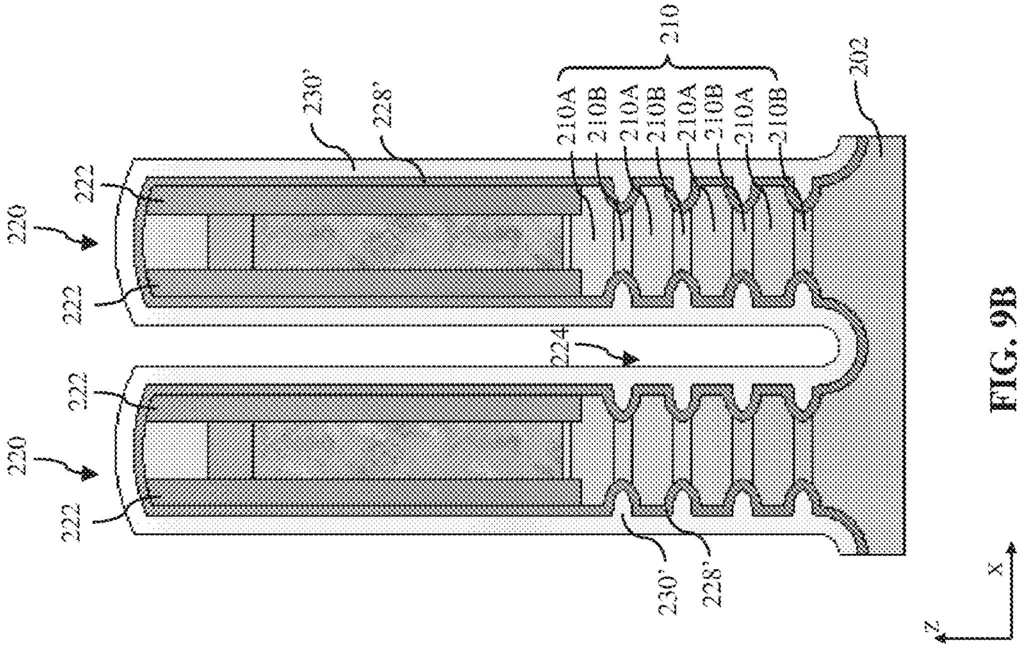
Figure 9A:
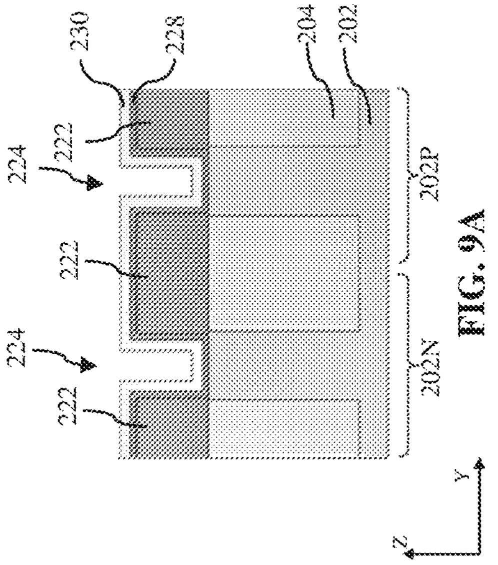

Referring to FIGS. 9A and 9B, a sacrificial layer 230' is then deposited over the inner spacer layer 228'. As depicted in FIG. 9B, the sacrificial layer 230' and the inner spacer layer 228' fill up the gaps 226 between the edge portions of the semiconductor layers 210A. In some embodiments, the sacrificial layer 230' comprises a dielectric material different than that of the inner spacer layer 228' and the gate spacers 222. In some embodiment, the sacrificial layer 230' include SiO. In some embodiments, the sacrificial layer 230' is conformally deposited by ALD, CVD, PVD, other suitable deposition process, or combinations thereof.

Figure 10B:
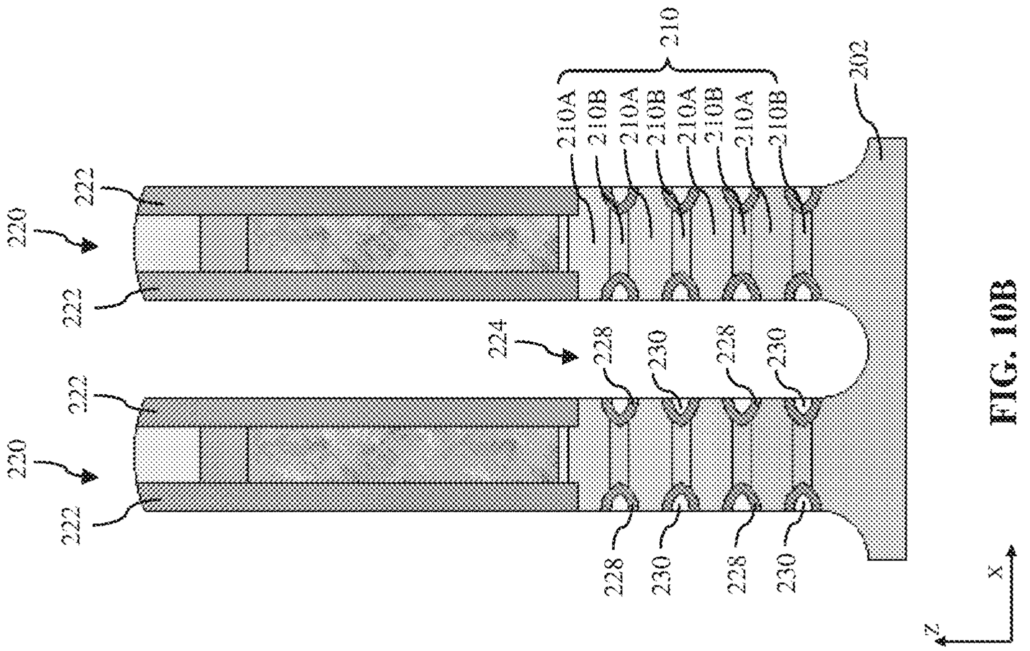
Figure 10A:
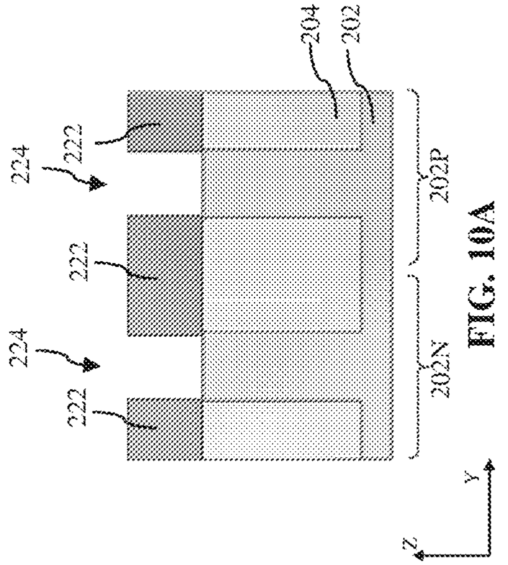

Now referring to FIGS. 10A and 10B, portions of the inner spacer layer 228' and the sacrificial layer 230' outside of the gaps 226 (i.e. along the sidewalls of the spacers 222 and sidewalls of the semiconductor layers 210A, over the top surface of the dummy gate structures 220 and the bottom surface of the S/D trenches 224) are removed until the sidewalls of the semiconductor layers 210A are exposed in the S/D trenches 224. The remained portions of the inner spacer layer 228' form the inner spacers 228. The remained portions of the sacrificial layer 230' form the sacrificial features 230. The removing process includes an etching process, such as dry etching, wet etching, or combinations thereof.

Figure 11B:
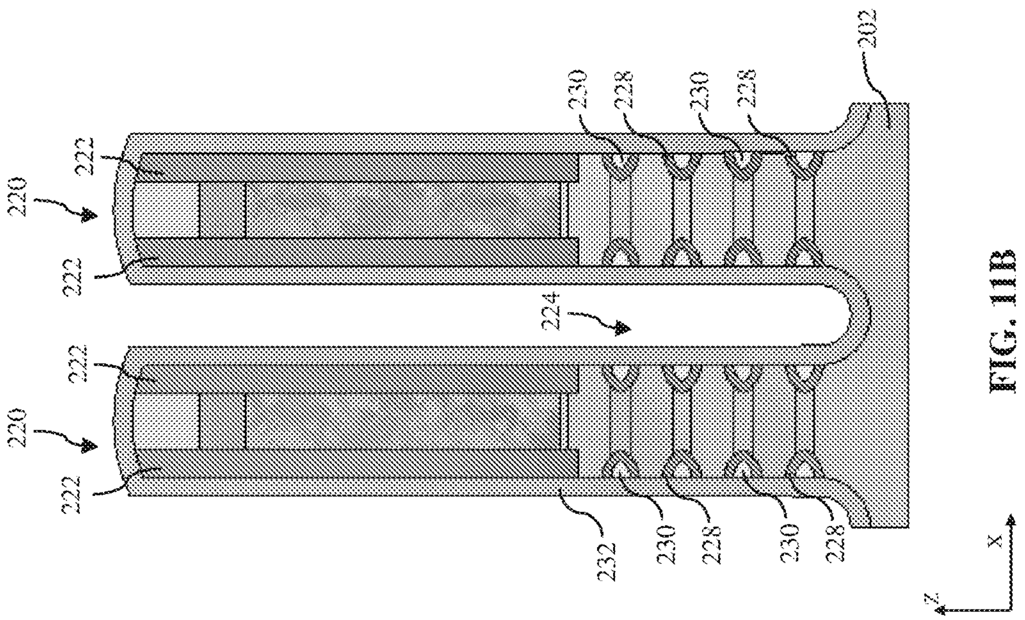
Figure 11A:
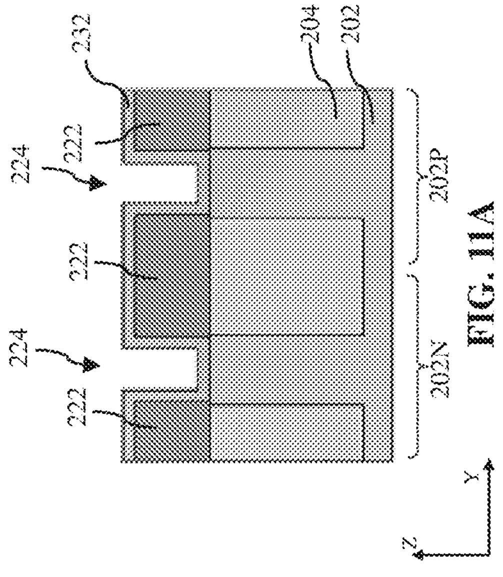

Referring to FIGS. 1, 11A-15A and 11B-15B, at operation 1100, the S/D features 240 are epitaxially grown in the S/D trenches 224 of a first region of the substrate 202. In the depicted embodiment, the first region is the N-type region 202N. In some other embodiments, the first region may be the P-type region 202P. Referring to FIGS. 11A and 11B, a hard mask layer 232 is deposited over the device 200. The hard mask layer 232 includes a dielectric material, such as SiN, SiON, metal oxide (such as Al2O3, TiO2, etc.), other suitable hard mask material, or combinations thereof. The hard mask layer 232 may be deposited by ALD, CVD, PVD, other suitable deposition, or combinations thereof. As depicted in FIGS. 11A and 11B, the hard mask layer 232 is deposited along sidewalls of the gate spacers 222, sidewalls of the semiconductor layers 210A, the inner spacers 228, and the sacrificial features 230.

Figure 12B:
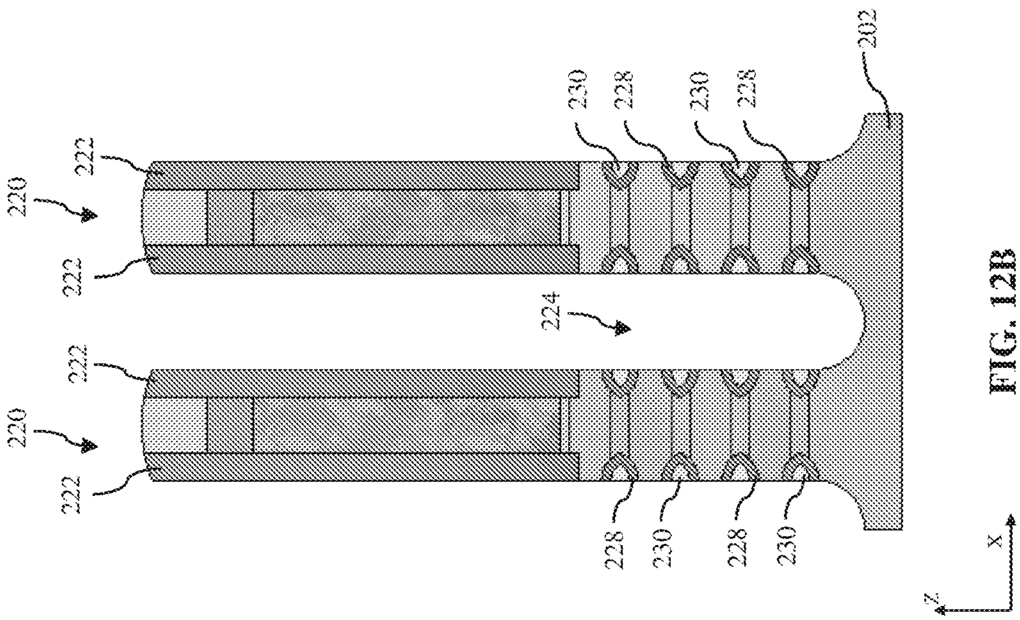
Figure 12A:
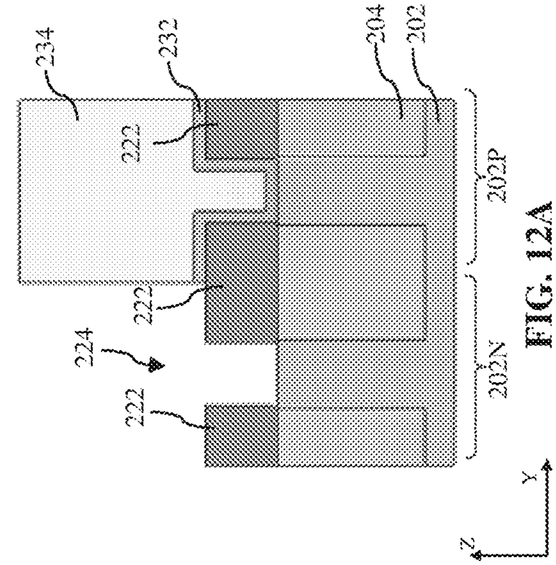
Figure 13B:
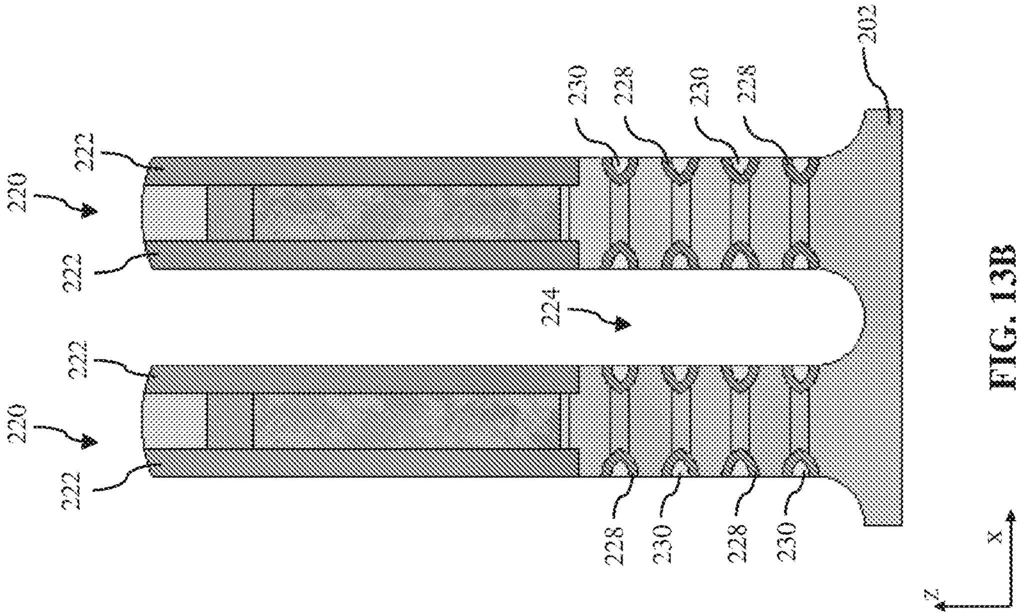
Figure 13A:
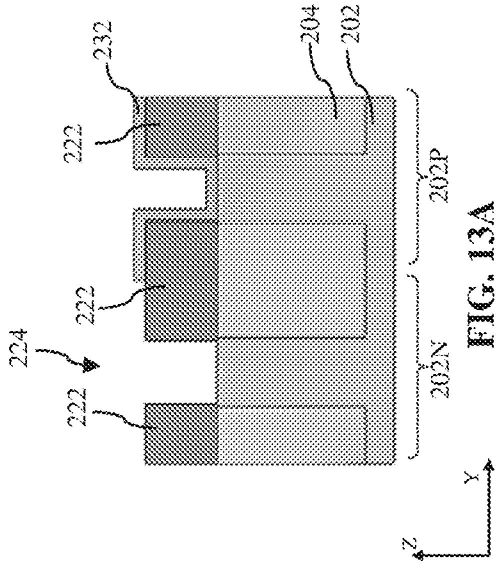

Referring to FIGS. 12A and 12B, a patterned photoresist layer 234 is formed over the device 200. The patterned photoresist layer 234 covers the second region (for example, the P-type region 202P) of the substrate 202. Thereafter, referring to FIGS. 13A and 13B, the exposed portion of the hard mask layer 232 in the N-type region 202N is removed by an etching process (such as dry etching, wet etching, or combinations thereof), thereby to expose the semiconductor layers 210A, the inner spacers 228, and the sacrificial features 230 from the S/D trench 224 in the N-type region 202N. The photoresist layer 234 is then be removed by a suitable process, such as a plasma ashing process.

Figure 14B:
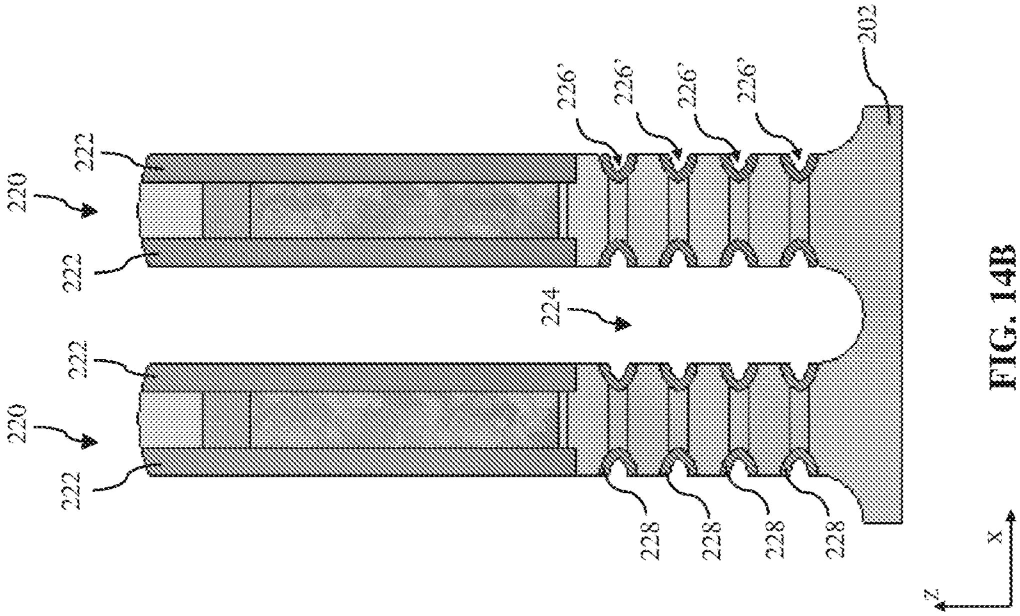
Figure 14A:
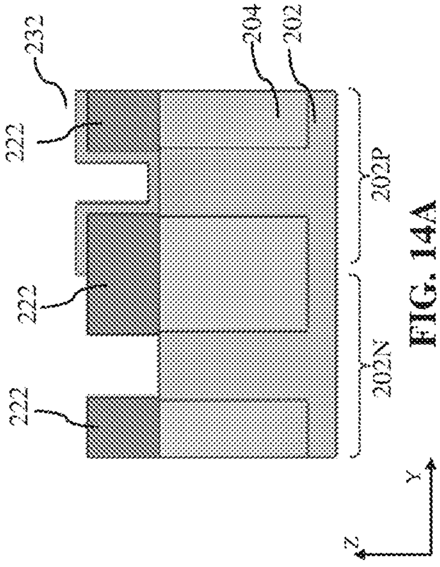

Referring to FIGS. 14A and 14B, the sacrificial features 230 in the N-type region 202N is removed by a pre-clean process. Since the sacrificial features 230 comprise a different material than those of the inner spacers 228 and the gate spacers 222, the sacrificial features 230 can be selectively removed by a selective etching process, such as a selective dry etching, a selective wet etching, or a combination thereof.

Figure 15B:
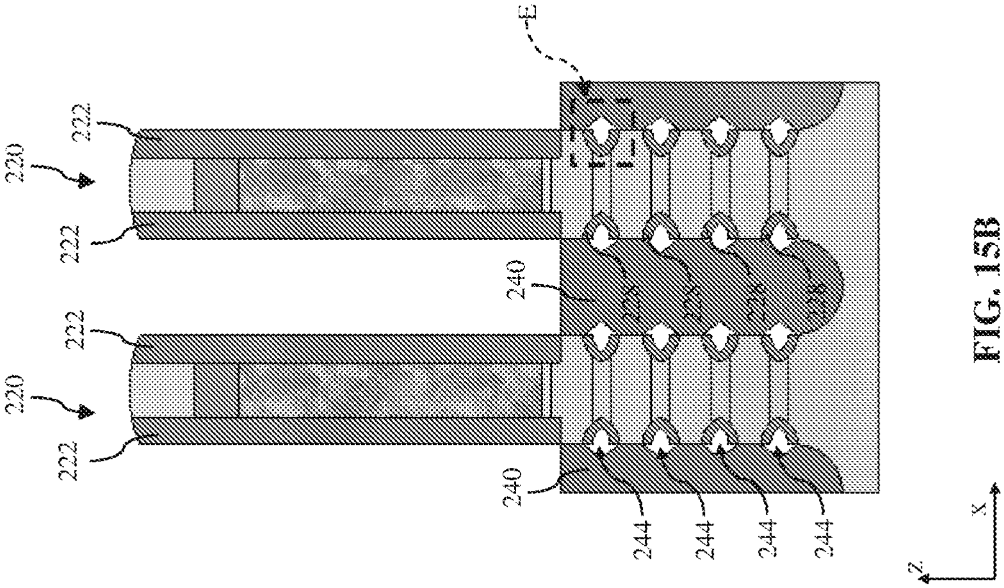
Figure 15A:
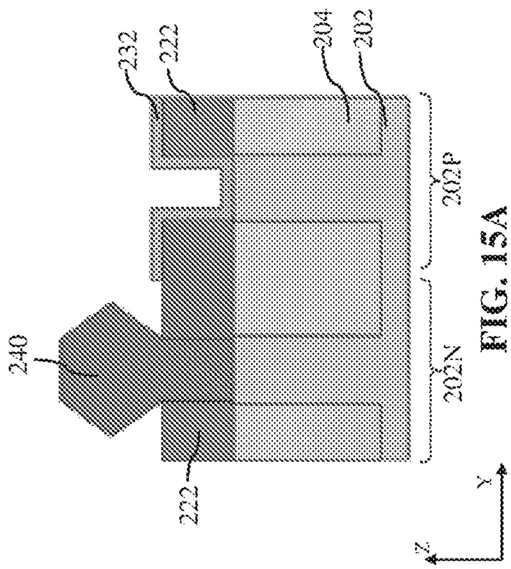

Referring to FIGS. 15A and 15B, an epitaxy process is implemented to grow the S/D features 240 in the S/D trench 224 of the N-type region 202N. The epitaxial S/D features may comprise different semiconductor materials for different type (N-type or P-type) S/D features. In the depicted embodiment, in the N-type region 202N, the N-type epitaxial S/D features 240 may include materials such as silicon and/or carbon, where the silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In some embodiments, the S/D features 240 include more than one crystalline layers formed one over another. For example, a first epitaxial layer grows from the exposed semiconductor material(s) in the S/D trenches 224, a second epitaxial layer grows over the first epitaxial layer, and a third epitaxial layer grows over the second epitaxial layer, etc. In some embodiments, the epitaxial S/D features 240 include materials and/or dopants that achieve desired tensile stress and/or compressive stress in the channel regions. In various embodiments, different epitaxial layer(s) of the epitaxial S/D features 240P may include same or different semiconductor materials.

Figures 15C, 15D, 15E:
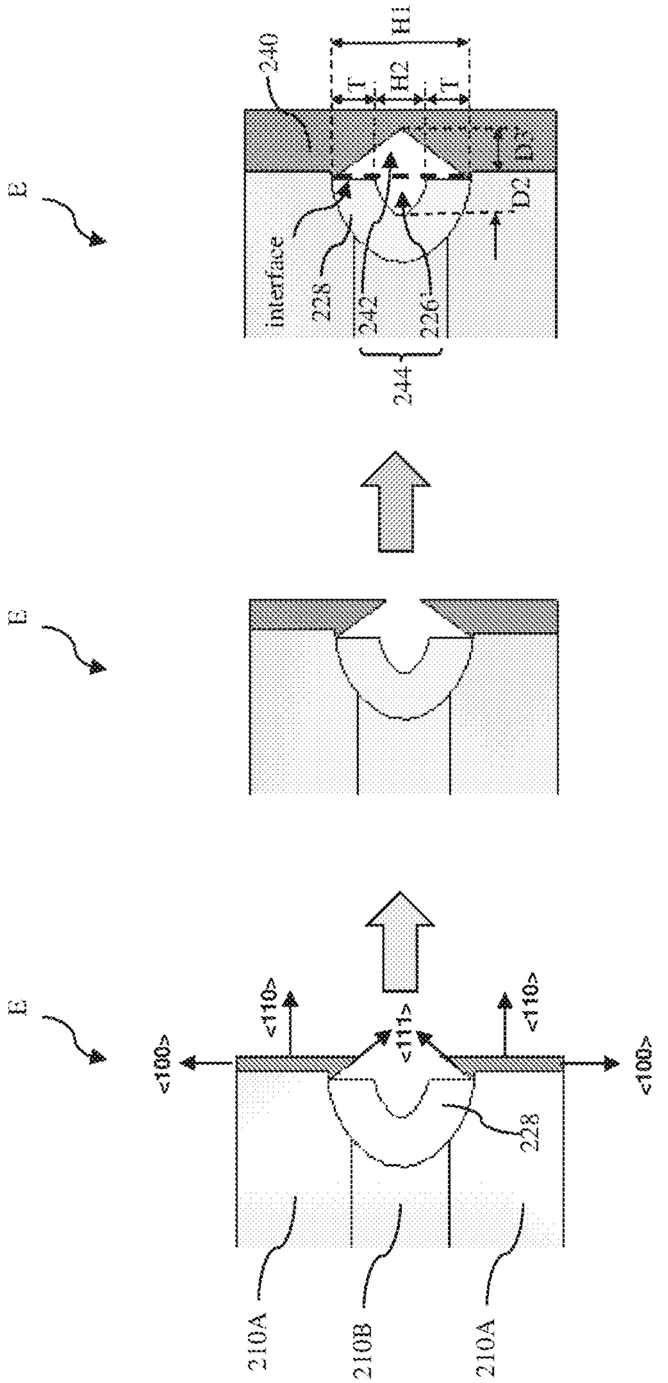
FIGS. 15C, 15D, and 15E illustrate the epitaxial growing process of the S/D feature in accordance with some embodiments of the present disclosure.

FIGS. 15C, 15D, and 15E are enlarged views of block E of FIG. 15B and illustrate the gradual epitaxy process of the first epitaxial layer of the S/D feature 240. The epitaxy process includes CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. In some embodiments, the epitaxy process is controlled such that it can grow new crystalline lattice with a well-defined orientation. Referring to FIG. 15C, in the present disclosure, the crystalline lattices are controlled to grow only in the directions of <100>, <110>, and <111> from the silicon materials (including the sidewalls of the semiconductor layers 210A and the recessed top surfaces of the substrate 202) exposed in the S/D trenches 224. There is substantially no crystalline material grown outside of the direction <111> towards the inner spacers 228. In some embodiments, the epitaxy process is performed under a temperature of about 600° C. to about 800° C., with a processing gas of hydrogen chloride (HC1) at a flow rate of about 100 sccm to about 300 sccm, thereby to retard the epitaxy growth outside of the direction <111> towards the inner spacers 228. Referring to FIG. 15E, the first epitaxial layer merges in the Z-direction. The merged first epitaxial layer, and the later formed second epitaxial layer, and/or other epitaxial layers form the epitaxial S/D feature 240. Therefore, the epitaxial S/D feature 240 includes facets along direction <111> forming isosceles triangle-shape recessions 242 away from the inner spacers 228. The epitaxial S/D feature 240 including the facets along direction <111> is also referred to as a facet S/D feature 240.

Figure 20A:
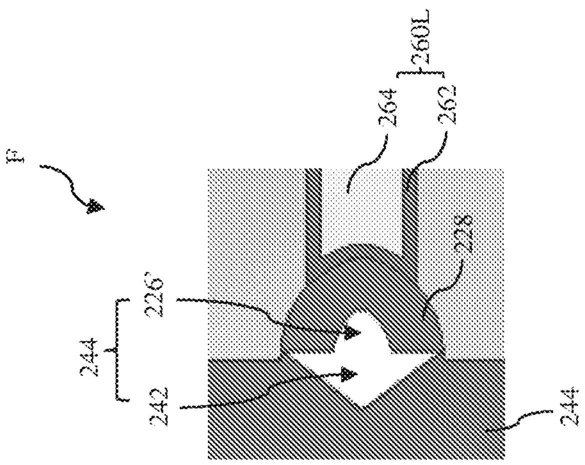
FIGS. 20A, 20B, and 20C illustrate cross-sectional views of different embodiments of the shape of the air gap between the inner spacer and the epitaxial S/D feature in accordance with some embodiments of the present disclosure.
Figure 20B:
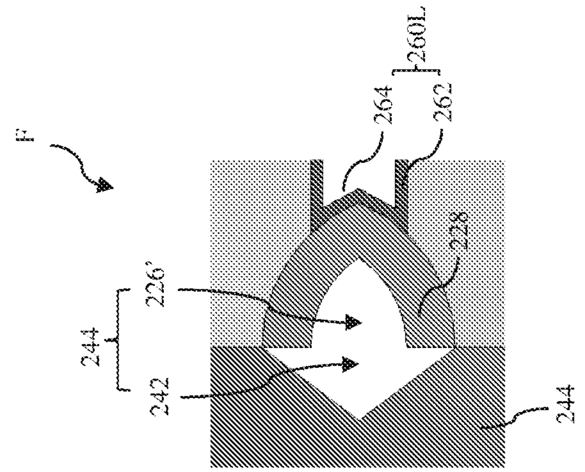
Figure 20C:
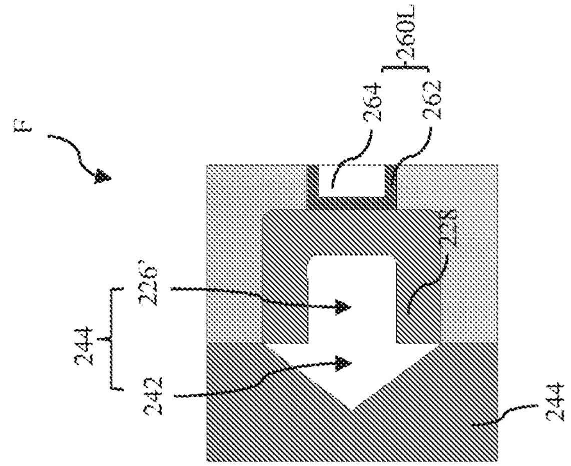

Referring to FIG. 15E, an air gap 244 is formed between the inner spacer 228 and the facet S/D feature 240. The air gap 244 includes a first portion 226' surrounded by the bended inner spacer 228 and a second portion 242 formed by the facets along direction <111> of the facet S/D features 240. The air gap 244 including the two portions 226' and 242 is also referred to as an enlarged air gap, compare with an air gap including only the portion 226'. In some embodiments, a cross-section view of the first portion 226' in the X-Z plane depends on the shape of the gap 226 and the inner spacer 228. In some embodiments, the first portion 226' has a half-ellipse-shape, a triangle-shape (with curved sides), a rectangular-shape (with round corners), or other shapes. Different shapes of the inner spacer 228 are illustrated in FIGS. 20A, 20B, and 20C, and will be discussed later. A cross-section view of the second portion 242 in the X-Z plane is substantially an isosceles triangle. The first portion 226' of the air gap 244 has a depth D2 in the X-direction, and the second portion 242 of the air gap 244 has a depth D3 in the X-direction. And, at an interface where the first portion 226' meet the second portion 242, the first portion 226' has a height (i.e. an opening size) H2 in the Z-direction, the second portion 242 has a height (i.e. an opening size) H1 in the Z-direction, and wherein, H1 is greater than H2. In other words, the second portion 242 has a greater opening in the Z-direction then the first portion 226'. In some embodiments, along each side of the height H2, the height H1 is substantially greater than the height H2 for a T, i.e. the thickness of the inner spacer 228. In some embodiments, the depth D2 is about 1 nm to about 19 nm; the depth D3 is about 2 nm to about 10 nm. In some embodiments, the height H1 is about 4 nm to about 20 nm; the height H2 is about 2 nm to about 18 nm.

In some implementations, the epitaxial S/D features 240 are doped during deposition by adding impurities to a source material of the epitaxy process. In some implementations, the epitaxial S/D features 240 are doped by an ion implantation process subsequent to a deposition process. In some implementations, annealing processes are performed to activate the dopants in the epitaxial S/D features 240 of the device 200.

Figure 16A:
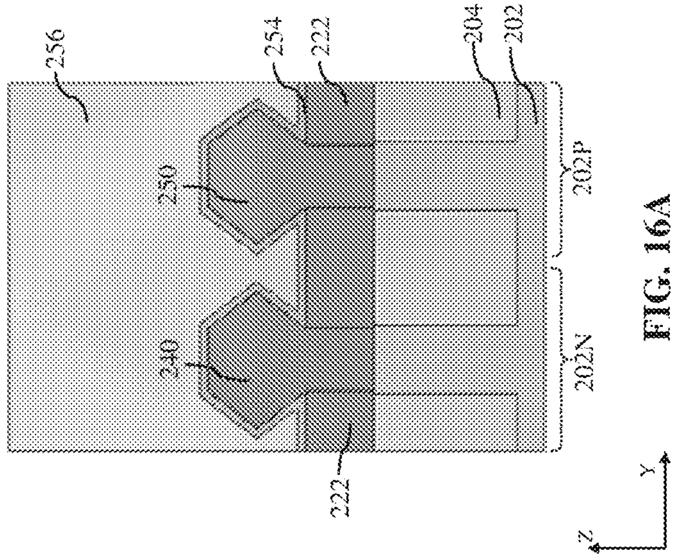
Figure 16B:
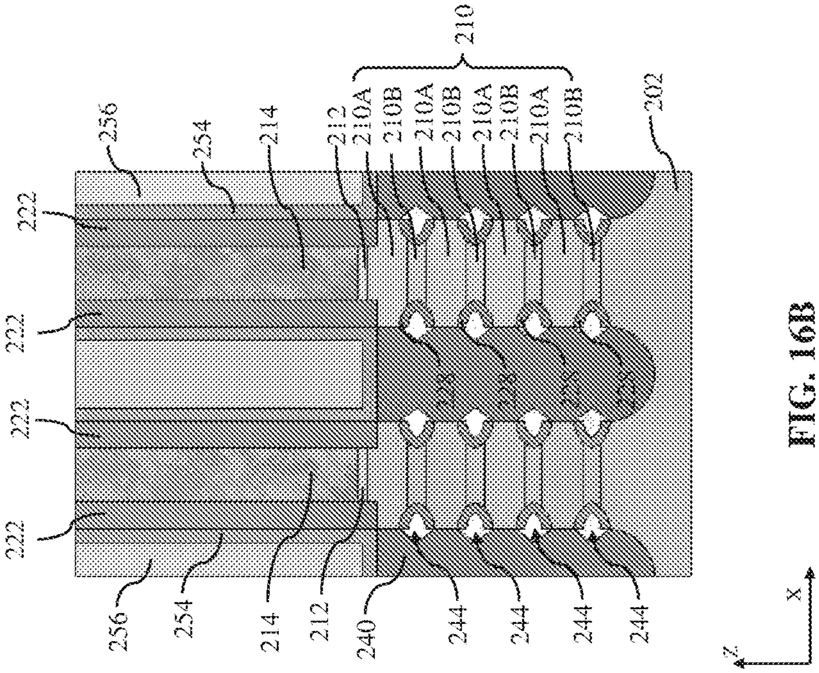
Figure 17A:
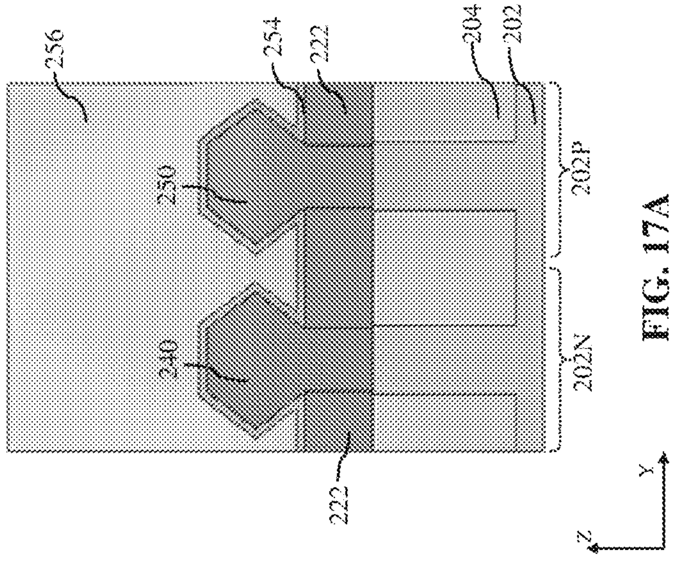
Figure 17B:
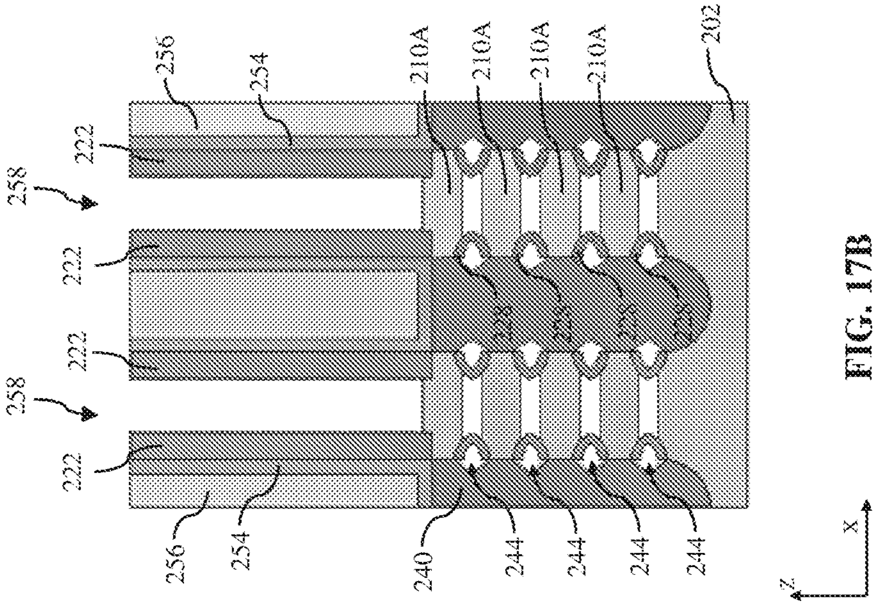

Referring to FIGS. 1, 16A and 16B, at operation 1120, the S/D features 250 are epitaxially grown in the S/D trenches 224 of the second region of the substrate 202. In the depicted embodiment, the second region is the P-type region 202P. In some other embodiments, the second region is the N-type region 202N. In the P-type region 202P, the epitaxial S/D features 250 may include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). The structures and profiles of the S/D features 250 in the second region are similar as those of the S/D features 240 in the first region. The formation process of the S/D features 250 is also similar as the formation process of the S/D features 240. For example, first, a hard mask layer is patterned to cover the first region, the sacrificial features 230 formed within the inner spacers 228 in the second region are then selectively removed. Thereafter, facet S/D features 250 are epitaxially grown in the S/D trenches in the second region along the directions <100>, <110>, and <111>. Similar as the facet S/D features 240, the facet S/D feature 250 also includes facets along direction <111> and forming recessions away from the inner spacers 228. Similar as in the first region, enlarged air gaps including two portions (a first portion formed in the bended inner spacer 228 and a second portion formed by the facets along direction <111> of the facet S/D features 250) are formed between the inner spacers 228 and the facet S/D feature 250.

Thereafter, an etch stop layer (ESL) 254 is deposited over the device 200, and an interlayer dielectric (ILD) layer 256 is formed over the ESL 254. In some embodiments, the ESL 254 includes a dielectric material such as SiO, SiON, SiN, SiCN, SiOC, SiOCN, other suitable materials, or combinations thereof. In some embodiments, the ILD layer 256 comprises a low-k (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ESL 254 and the ILD layer 256 may be formed by deposition processes such as CVD, flowable CVD (FCVD), spin-on-glass (SOG), other suitable methods, or combinations thereof. Subsequently, a planarization process (for example, a CMP) is performed to remove the top portion of the device 200 (including the hard mask layers 216 and 218 of the dummy gate structure 220 and a top portion of the ILD layer 256) to expose the dummy gate electrode 214.

Referring to FIGS. 1, 17A, 17B, 18A, and 18B, at operation 1140, a metal gate replacement process is performed to replace the dummy gate structures 220 with metal gate structures 260. The metal gate replacement process includes various processing steps. For example, referring to FIGS. 17A and 17B, the dummy gate structures 220 are removed to form gate trenches 258 exposing the channel regions of the stacks 210. In some embodiments, removing the dummy gate structures 220 comprises one or more etching processes, such as wet etching, dry etching, or other etching techniques. The semiconductor layers 210A and 210B are then exposed in the gate trenches 258. Subsequently, the semiconductor layers 210B are selectively removed from the gate trenches 258. Due to the different materials of the semiconductor layers 210A and 210B, the semiconductor layers 210B are removed by a selective oxidation/etching process similar as that to remove the edge portions of the semiconductor layers 210B before forming the inner spacers. In some embodiments, the semiconductor layers 210A are slightly etched or not etched during the operation 1140. Thereby, the semiconductor layers 210A are suspended in the channel regions of the stacks 210 and stacked up along the direction (Z-direction) substantially perpendicular to the top surface of the substrate 202 (X-Y plane). The suspended semiconductor layers 210A are also referred to as channel semiconductor layers 210A.

Figure 18B:
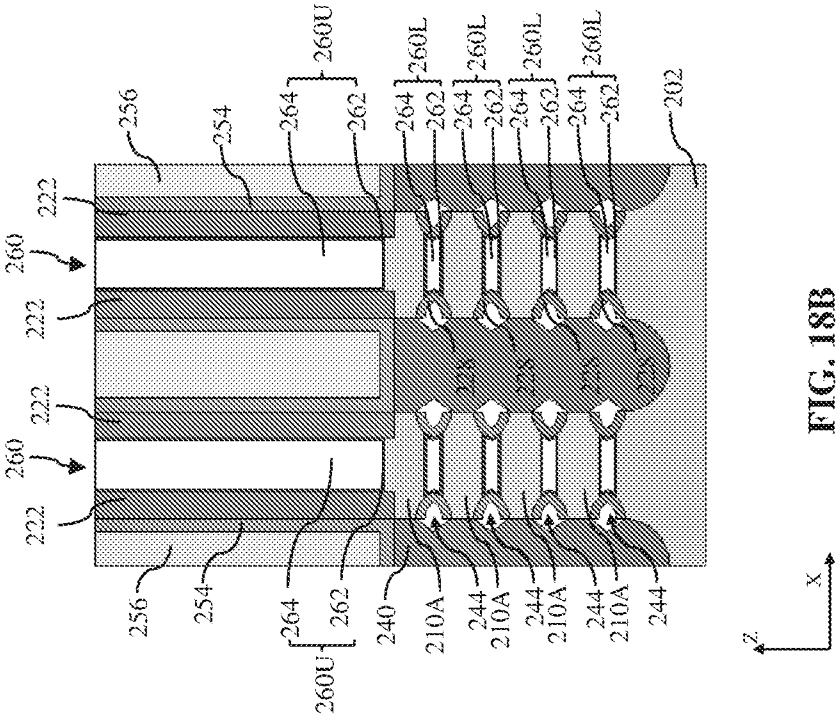
Figure 18A:
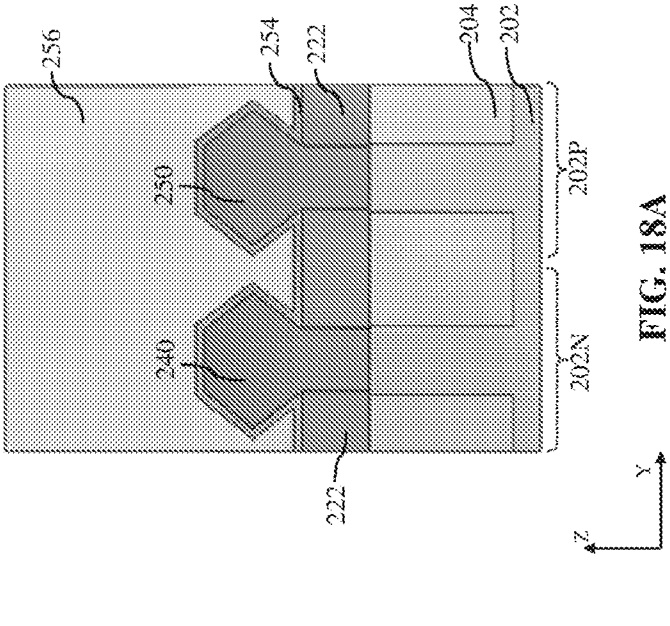

Thereafter, referring to FIGS. 18A and 18B, metal gate structures 260 are formed in the channel regions of the stacks 210. The metal gate structures 260 wrap each of the suspended semiconductor layers 210A. Referring to FIG. 18B, each metal gate structure includes an upper portion 260U in place of the removed dummy gate structure 220 and a plurality of lower portions 260L in place of the removed semiconductor layers 210B. In other words, the upper portion 260U is above the topmost channel semiconductor layer 210A, and the lower portions 260L are sandwiched by the channel semiconductor layers 210A and are between the inner spacers 228. In some embodiments, each metal gate structure 260 (including the upper portion 260U and the lower portions 260L) may include a gate dielectric layer 262 wrapping around each of the channel semiconductor layers 210A, a metal gate electrode 264 over the gate dielectric layer 262, and other suitable layers. The gate dielectric layer 262 includes a high-k (K>3.9) dielectric material, such as HfO2, HfSiO, HfSiO4, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. In some embodiments, the gate dielectric layer 262 is deposited by CVD, PVD, ALD, and/or other suitable method. In some embodiments, each metal gate electrode 264 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrode 264 may be formed by any suitable method, such as CVD, ALD, PVD, plating, chemical oxidation, thermal oxidation, other suitable methods, or combinations thereof.

Figure 19B:
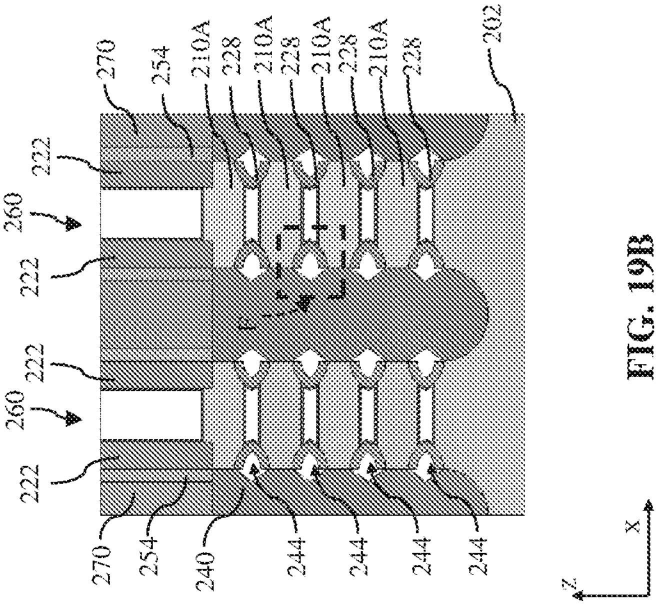
Figure 19A:
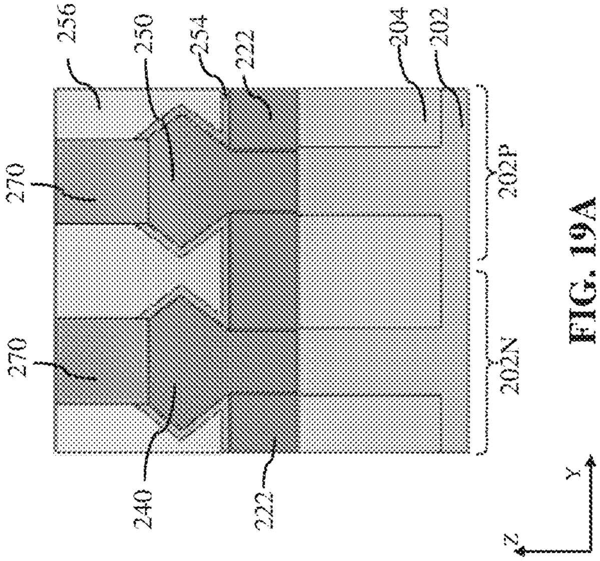

Now, referring to FIGS. 1, 19A and 19B, at operation 1160, further processing is performed to complete the fabrication of the device 200. For example, it may form S/D contacts 270 over the facet S/D features 240 and/or 250. Thereafter, one or more polishing processes (for example, CMP) are applied to remove any excess conductive materials and planarize the top surface of the device 200. Subsequently, other multilayer interconnect features (not shown), such as metal lines, gate contacts, vias, as well as ILD layers and/or etch stop layer are formed over the device 200, configured to connect the various features to form a functional circuit that comprises the different semiconductor devices.

FIGS. 20A, 20B, and 20C are enlarged views of block F of FIG. 19B and illustrate different shapes of the inner spacers 228 and the enlarged air gap 244 according to different embodiments of the present disclosure. As discussed above, the enlarged air gap 244 includes a first portion 226' formed within the bended inner spacers and a second portion 242 formed by the facets of the S/D feature along the direction <111>. The bended inner spacers 228 may be of different half-ring-shapes. For example, the half-ring-shape may be a C-shape (FIG. 20A), a V-shape with curved branches (FIG. 20B), or a half-rectangular-ring-shape with round corners (FIG. 20C). Accordingly, the first portion 226' of the enlarged air gap 244 are of different shapes. For example, the first portion 226' may be a half-ellipse-shape (FIG. 20A), a triangle-shape with curved sides (FIG. 20B), a rectangular-shape with round corners (FIG. 20C), or other suitable shapes. The second portion 242 is of a substantial isosceles triangle shape. At the interface where the first portion 226' meet the second portion 242, the height of the first portion 226' is less than the height of the second portion 242.

In a conventional semiconductor device, the epitaxial S/D feature may physically contact the entire surface of the inner spacer, or a very small gap may be formed between the epitaxial S/D feature and the inner spacer. Since the inner spacer includes a material having a relative high-K value (for example, a K value of about 5 to about 7) and a thickness of the inner spacer is limited, a relative high parasitic capacitance may occur between the epitaxial S/D feature and the metal gate structure. However, in the present disclosure, the first epitaxial S/D layer only grow along the directions <100>, <110>, and <111> to form the facet S/D features. Thus, an enlarged air gap is formed between the inner spacer and the facet S/D feature. The enlarged air gap enlarges the space between the S/D feature and the metal gate structure, thereby reduce the parasitic capacitance therebetween. In addition, the inner spacers are protected by the enlarged air gap from being damaged during the fabrication process.

Although not intended to be limiting, one or more embodiments of the present disclosure provide many benefits to a semiconductor device and a formation process thereof. For example, embodiments of the present disclosure provide a semiconductor device with bended inner spacers (towards the metal gate structures) and facet S/D features. The facet S/D features includes crystalline layers grown along the directions <100>, <110>, and <111>, thereby an enlarged air gap can be formed between the bended inner spacers and the epitaxial S/D features. Thus, the space between the epitaxial S/D feature and the metal gate structure is enlarged and the parasitic capacitance therebetween can be reduced. In addition, the inner spacers are protected by the enlarged air spacer from being damaged during the fabrication process. Therefore, the performance of the semiconductor device is improved.

The present disclosure provides for many different embodiments. Semiconductor device having bended inner spacers and facet S/D structure and methods of fabrication thereof are disclosed herein. A method of forming a semiconductor device comprises alternately forming first semiconductor layers and second semiconductor layers over a substrate, wherein the first semiconductor layers and the second semiconductor layers include different materials and are stacked up along a direction substantially perpendicular to a top surface of the substrate; forming a dummy gate structure over the first and second semiconductor layers; forming a source/drain (S/D) trench along a sidewall of the dummy gate structure; forming inner spacers between edge portions of the first semiconductor layers, wherein the inner spacers are bended towards the second semiconductor layers; and epitaxially growing a S/D feature in the S/D trench, wherein the S/D feature contacts the first semiconductor layers and includes facets forming a recession away from the inner spacers.

In some embodiments, the forming the inner spacers between edge portions of the first semiconductor layers includes selectively removing edge portions of the second semiconductor layers from the S/D trench; conformally depositing an inner spacer layer in the S/D trench to partially fill in the removed edge portions of the second semiconductor layers; and removing portions of the inner spacer layer along the direction substantially perpendicular to the top surface of the substrate to form the inner spacers. In some further embodiments, the inner spacer layer is conformally deposited for a thickness of about 1 nm to about 5 nm.

In some embodiments, the forming the inner spacers between edge portions of the first semiconductor layers further includes forming a sacrificial layer over the inner spacer layer in the S/D trench, wherein the sacrificial layer and the inner spacer layer fill up the removed edge portions of the second semiconductor layers; and removing portions of the sacrificial layer along the direction substantially perpendicular to the top surface of the substrate to expose sidewalls of the first semiconductor layers in the S/D trench. In some further embodiments, the forming the inner spacers between edge portions of the first semiconductor layers further includes forming a hard mask in a first region of the substrate; and removing remaining portions of the sacrificial layer in a second region of the substrate.

In some embodiments, the epitaxially growing a S/D feature in the S/D trench includes epitaxially growing a first epitaxial S/D layer from the first semiconductor layers and the first epitaxial S/D layer being free from the inner spacers. In some further embodiments, the epitaxially growing a S/D feature in the S/D trench includes epitaxially growing the first epitaxial S/D layer with hydrogen chloride (HCl) at a flow rate of about 100 sccm to about 300 sccm, and under a temperature of about 600° C. to about 800° C.

In some embodiments, the exemplary method further comprises replacing the dummy gate structure with a metal gate structure, wherein the metal gate structure including a top portion over a top most first semiconductor layer and bottom portions between the first semiconductor layers, and sidewalls of the bottom portions of the metal gate structure contact the bended inner spacers.

Another exemplary method comprises forming a first semiconductor stack over a first region of a substrate and forming a second semiconductor stack over a second region of the substrate, wherein each of the first semiconductor stack and the second semiconductor stack includes first semiconductor layers and second semiconductor layers having different materials, and wherein the first semiconductor layers and second semiconductor layers are stacked up along a direction substantially perpendicular to a top surface of the substrate; forming a dummy gate structure over channel regions of the first semiconductor stack and the second semiconductor stack; selectively removing edge portions of the second semiconductor layers to form first gaps between edge portions of the first semiconductor layers; conformally forming inner spacers partially filling in the first gaps; forming sacrificial features to fill up the first gaps with the inner spacers; forming a hard mask covering the second region of the substrate; removing the sacrificial features in the first region of the substrate to form second gaps surrounded by the inner spacers; and epitaxially growing a source/drain (S/D) feature over a S/D region in the first region of the substrate, wherein the S/D feature is epitaxially grown from the sidewalls of the first semiconductor layers and merged along the direction substantially perpendicular to the top surface of the substrate to form third gaps away from the inner spacers.

In some embodiments, the S/D feature is epitaxially grown to form facets along the direction <111> to form the third gaps. In some embodiments, a depth of each of the first gap is about 5 nm to about 20 nm. In some embodiments, an opening of each of the second gap is about 2 nm to about 18 nm. In some embodiments, an opening of each of the third gap is about 4 nm to about 20 nm.

An exemplary semiconductor device comprises a semiconductor stack over a substrate, wherein the semiconductor stack includes semiconductor layers separated from each other and stacked up along a direction substantially perpendicular to a top surface of the substrate; a gate structure over a channel region of the semiconductor stack and wrapping each of the semiconductor layers; an inner spacer between edge portions of the semiconductor layers and being bended towards the gate structure; and a source/drain (S/D) feature over a S/D region of the semiconductor stack and contacting sidewalls of the semiconductor layers, wherein the S/D feature includes facets forming a first portion of an air gap between the inner spacer and the S/D feature, and the bended inner spacer forms a second portion of the air gap between the inner spacer and the S/D feature.

In some embodiments, the first portion of the air gap has a cross-section view of an isosceles triangle-shape. In some embodiments, the facets of the S/D features forming the first portion of the air gap are grown along a direction <111>. In some embodiments, the second portion of the air gap has a cross-section view of a half-ellipse-shape, a triangle-shape with curved sides, or a rectangular-shape with round corners. In some embodiments, at an interface wherein the first portion of the air gap meets the second portion of the air gap, a height of the first portion of the air gap is greater than a height of the second portion of the air gap. In some embodiments, the bended inner spacer has a cross-section view of a half-ring-shape. In some embodiments, a thickness of the inner spacer is about 1 nm to about 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a semiconductor stack over a substrate, wherein the semiconductor stack includes semiconductor layers separated from each other and stacked up along a direction substantially perpendicular to a top surface of the substrate;

a gate structure over a channel region of the semiconductor stack and wrapping each of the semiconductor layers;

an inner spacer between edge portions of the semiconductor layers and being bended towards the gate structure; and a source/drain (S/D) feature over a S/D region of the semiconductor stack and contacting sidewalls of the semiconductor layers, wherein the S/D feature includes facets forming a first portion of an air gap between the inner spacer and the S/D feature, wherein the inner spacer surrounds a second portion of the air gap between the inner spacer and the S/D feature, and wherein a portion of the inner spacer is laterally interposed between one of the semiconductor layers and the second portion of the air gap.

2. The semiconductor device of claim 1, wherein the first portion of the air gap has a cross-section view of an isosceles triangle-shape.

3. The semiconductor device of claim 1, wherein the facets of the S/D feature forming the first portion of the air gap are grown along a direction <111>.

4. The semiconductor device of claim 1, wherein the second portion of the air gap has a cross-section view of a half-ellipse-shape, a triangle-shape with curved sides, or a rectangular-shape with round corners.

5. The semiconductor device of claim 1, wherein, at an interface where the first portion of the air gap meets the second portion of the air gap, a height of the first portion of the air gap is greater than a height of the second portion of the air gap.

6. The semiconductor device of claim 1, wherein the inner spacer has a cross-section view of a half-ring-shape.

7. The semiconductor device of claim 1, wherein a thickness of the inner spacer is about 1 nm to about 5 nm.

8. A semiconductor device comprising:

semiconductor layers stacked one over another over a substrate;

a gate structure wrapping around the semiconductor layers;

an inner spacer between edge portions of the semiconductor layers and interfacing the gate structure; and a source/drain (S/D) feature contacting sidewalls of the semiconductor layers, wherein the S/D feature includes facets, wherein the facets and the inner spacer form an air gap, wherein the air gap includes a first portion extending into the S/D feature and a second portion extending into the inner spacer, and wherein a portion of the inner spacer protrudes into one of the semiconductor layers.

9. The semiconductor device of claim 8, wherein the inner spacer comprises a bended shape around the second portion of the air gap.

10. The semiconductor device of claim 8, wherein, along a direction perpendicular to a top surface of the substrate, a height of the first portion is greater than a height of the second portion.

11. The semiconductor device of claim 8, wherein the facets of the S/D feature are grown along a direction <111>.

12. The semiconductor device of claim 8, wherein a thickness of the inner spacer is about 1 nm to about 5 nm.

13. The semiconductor device of claim 8, wherein the inner spacer comprises silicon oxynitride, silicon carbonitride, silicon oxycarbide, silicon oxycarbonitride, or a combination thereof.

14. The semiconductor device of claim 8, wherein the S/D feature partially extends into the substrate.

15. A semiconductor device comprising:

an active region disposed over a substrate, the active region comprising a vertical stack of channel layers;

a gate structure wrapping around the channel layers;

a bended inner spacer between edge portions of the channel layers and interfacing the gate structure; and a source/drain (S/D) feature contacting sidewalls of the channel layers and partially extending into the substrate, wherein the S/D feature includes facets, wherein the facets and the bended inner spacer form an air gap, wherein the air gap includes a first portion extending into the S/D feature and a second portion extending into the bended inner spacer, wherein, along a direction perpendicular to a top surface of the substrate, a first height of the first portion is greater than a second height of the second portion, and wherein a portion of the bended inner spacer separates the first portion of the air gap from one of the channel layers along a direction parallel to the top surface of the substrate.

16. The semiconductor device of claim 15, wherein the first height is between about 4 nm and about 20 nm, and wherein the second height is between about 2 nm and about 18 nm.

17. The semiconductor device of claim 15, wherein the facets of the S/D feature are grown along a direction <111>.

18. The semiconductor device of claim 15, wherein a thickness of the bended inner spacer is about 1 nm to about 5 nm.

19. The semiconductor device of claim 15, wherein sidewalls of the second portion of the air gap each have a curved profile.

20. The semiconductor device of claim 19, wherein the sidewalls converge to a point.

* * * * *